(12) United States Patent
Shimizu

(10) Patent No.: US 7,786,525 B2
(45) Date of Patent: Aug. 31, 2010

(54) NONVOLATILE SEMICONDUCTOR MEMORY DEVICE

(75) Inventor: Kazuhiro Shimizu, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 233 days.

(21) Appl. No.: 12/104,945

(22) Filed: Apr. 17, 2008

(65) Prior Publication Data

US 2008/0258202 A1  Oct. 23, 2008

(30) Foreign Application Priority Data

Apr. 17, 2007  (JP) ............................. 2007-108233

(51) Int. Cl.
*H01L 29/788* (2006.01)
(52) U.S. Cl. ................. 257/316; 257/317; 257/E27.103
(58) Field of Classification Search ................. 257/316, 257/317, E27.103
See application file for complete search history.

(56) References Cited

U.S. PATENT DOCUMENTS

| 5,949,101 | A | 9/1999 | Aritome |
| 6,768,161 | B2 | 7/2004 | Kinoshita et al. |
| 6,969,884 | B2 | 11/2005 | Kitamura et al. |
| 6,987,047 | B2 | 1/2006 | Iguchi et al. |
| 7,196,370 | B2 | 3/2007 | Kai et al. |
| 2004/0099900 | A1 | 5/2004 | Iguchi et al. |
| 2005/0167745 | A1 | 8/2005 | Ishida et al. |
| 2005/0258463 | A1* | 11/2005 | Yaegashi et al. ............ 257/296 |

FOREIGN PATENT DOCUMENTS

| JP | 8-125148 | 5/1996 |
| JP | 2000-12709 | 1/2000 |

* cited by examiner

*Primary Examiner*—Tu-Tu V Ho
(74) *Attorney, Agent, or Firm*—Oblon, Spivak, McClelland, Maier & Neustadt, L.L.P.

(57) ABSTRACT

A nonvolatile semiconductor memory device includes an element isolation insulating film buried in first trenches, a floating gate electrode formed on an element forming region with a first gate insulating film being interposed between them, and a second gate insulating film formed on upper portions of the floating gate electrode and an element isolation insulating film. The floating gate electrode is formed so as to have a side that extends from a bottom thereof to its upper portion and is substantially an extension of a sidewall of each first trench. The element isolation insulating film includes a portion located between its sidewall and the sidewall of a second trench, and the portion of the element isolation insulating film having a film thickness in a direction along the upper surface of the semiconductor substrate. The film thickness is equal to a film thickness of the second gate insulating film.

20 Claims, 6 Drawing Sheets

NONVOLATILE SEMICONDUCTOR MEMORY DEVICE

CROSS-REFERENCE TO RELATED APPLICATIONS

This application is based on and claims the benefit of priority from the prior Japanese Patent Application No. 2007-108233, filed on Apr. 17, 2007, the entire contents of which are incorporated herein by reference.

BACKGROUND OF THE INVENTION

1. Field of the Invention

The present invention relates to a nonvolatile semiconductor memory device including a floating gate electrode and a control gate electrode.

2. Description of the Related Art

NAND flash memories are typical as a large-capacity high-density nonvolatile semiconductor memory device. A memory cell structure of the NAND flash memory device employs a self-alignment shallow trench isolation (STI) structure which provides highest density integration. In the STI structure, for example, an element isolation trench is formed in a silicon substrate. An insulating film such as a silicon oxide film is buried in the trench. The insulating film serves as an element isolation insulating material.

A channel region on the silicon substrate is isolated by an element isolation region of the STI structure. A tunnel insulating film is formed on an entire channel region. The tunnel insulating film is rendered as thin as possible so that a tunnel current can flow therethrough. A floating gate electrode is formed on the tunnel insulating film. The floating gate electrode serves as a charge accumulation layer. The floating gate electrode has a side end with the same width as the element forming region. The element isolation insulating film is in contact with the floating gate electrode. A part of the floating gate electrode projects so as to be located higher than an upper surface of the element isolation insulating film. An upper surface of the floating gate electrode faces the control gate electrode with an intergate insulating film being interposed therebetween. A vertical profile control is applied to the control gate electrode and the floating gate electrode so that side ends of the electrodes are trued up in a self-alignment manner. An n-type diffusion layer is formed in a surface layer of the silicon substrate located between the adjacent gate electrodes.

In the above-described structure, the trench is formed and the element isolation insulating film is buried in the trench after films for the floating gate electrode have been deposited. Accordingly, an end of the gate electrode is not exposed. Furthermore, since the floating gate electrode is completely isolated in the element isolation region, the floating gate electrode need not be cut into a slit-like shape on the element isolation region. As a result, widths of an element region and an element isolation region can be refined up to minimum rules. On the other hand, in order that a capacity between the floating gate electrode and the control gate electrode may be increased, the floating gate electrode is structure to face the control gate electrode on a side of a charge accumulation layer.

The memory cell of the above-described structure has no structure more refined than periodic widths of the channel region and the element isolation region. Accordingly, highest density integration can be realized. However, since a coupling ratio of the memory cell depends upon an exposed height of the floating gate electrode, exposed height variations due to process variation result in an increase in characteristic variations. In particular, since variations in the coupling ratio causes fluctuations in writing voltage, a threshold distribution is spread. This is disadvantageous both in high-speed operation and in reliability of the semiconductor device. A parasitic capacity between floating gate electrodes of adjacent memory cells cannot be ignored as a cause for characteristic variations with progress of refinement. The above-described structure includes a region opposed to the floating gate electrode with the element isolation insulating film being interposed therebetween. This results in occurrence of parasitic capacity, whereupon an amount of discharge accumulated in the floating gate electrodes of the adjacent memory cells. As a result, the threshold distribution setting cannot be provided with a sufficient margin for a charge retention characteristic.

In view of the above-described problem, publication JP-A-H08-125148 discloses a structure which can overcome the above-described problem of variations in the coupling ratio. More specifically, the publication employs a side wall transfer transistor (SWATT) structure. In the disclosed SWATT structure, an element isolation insulating film is located lower than an upper surface of a silicon substrate. A floating gate electrode has all sidewalls opposed to a control gate electrode with a gate insulating film being interposed therebetween. Consequently, an entire sidewall height of the floating gate electrode contributes to the coupling ratio, whereupon fluctuations in the coupling ratio can be suppressed.

However, the insulating film sandwiched between the silicon substrate and the control gate electrode is an intergate insulating film. Accordingly, when a writing voltage is applied to the control gate, the writing voltage of, for example, 20 V is also applied to an intergate insulating film. As a result, an insulation breakdown occurs in the intergate insulating film, resulting in breakdown of the element or device.

As obvious from the foregoing, the conventional memory cell with the self-alignment STI structure is devoid of means that can improve the coupling ratio and suppress variations in the coupling ratio, and can ensure the breakdown voltage of the memory cell. As a result, the conventional memory cell cannot achieve both high reliability and high densification.

BRIEF SUMMARY OF THE INVENTION

The invention provides a nonvolatile semiconductor memory device comprising a semiconductor substrate having an upper surface in which a plurality of first trenches are formed such that an element forming region is defined, the first trenches having respective sidewalls, an element isolation insulating film buried in the first trenches, a floating gate electrode formed on the element forming region with a first gate insulating film being interposed therebetween, the floating gate electrode being formed so as to have a sidewall which extends from a bottom thereof to an upper portion thereof and is substantially an extension of a sidewall of each first trench, a second gate insulating film formed on upper portions of the floating gate electrode and the element isolation insulating film, and a control gate electrode formed on the second gate insulating film. In the device, the element isolation insulating film has an upper end located lower than an upper surface of the floating gate electrode and the upper end of the element isolation insulating film includes a sidewall having such a height as to be in contact with the floating gate electrode. The element isolation insulating film includes a central portion in which a second trench is formed, and the second trench has a bottom located lower than the upper surface of the semiconductor substrate. The floating gate electrode includes a sidewall further including an upper portion opposed to the control gate electrode with the second gate insulating film being interposed therebetween. The sidewall of the floating gate electrode includes a lower portion opposed to the control gate electrode with the element isolation insulating film and the second gate insulating film being interposed therebetween in turn. The control gate electrode is buried in the second trench with the second gate insulating film being interposed therebetween. The control gate electrode has a lower end including a sidewall opposed to a sidewall of the trench of the semiconductor substrate with the second gate insulating film and the element isolation insulating film being interposed therebetween. The element isolation insulating film includes a portion located between the sidewall thereof and the sidewall of the second trench, said portion of the element isolation insulating film having a film thickness in a direction along the upper surface of the semiconductor substrate, said film thickness being equal to a film thickness of the second gate insulating film.

BRIEF DESCRIPTION OF THE DRAWINGS

Other objects, features and advantages of the present invention will become clear upon reviewing the following description of one embodiment with reference to the accompanying drawings, in which.

DETAILED DESCRIPTION OF THE INVENTION

Figure 1:
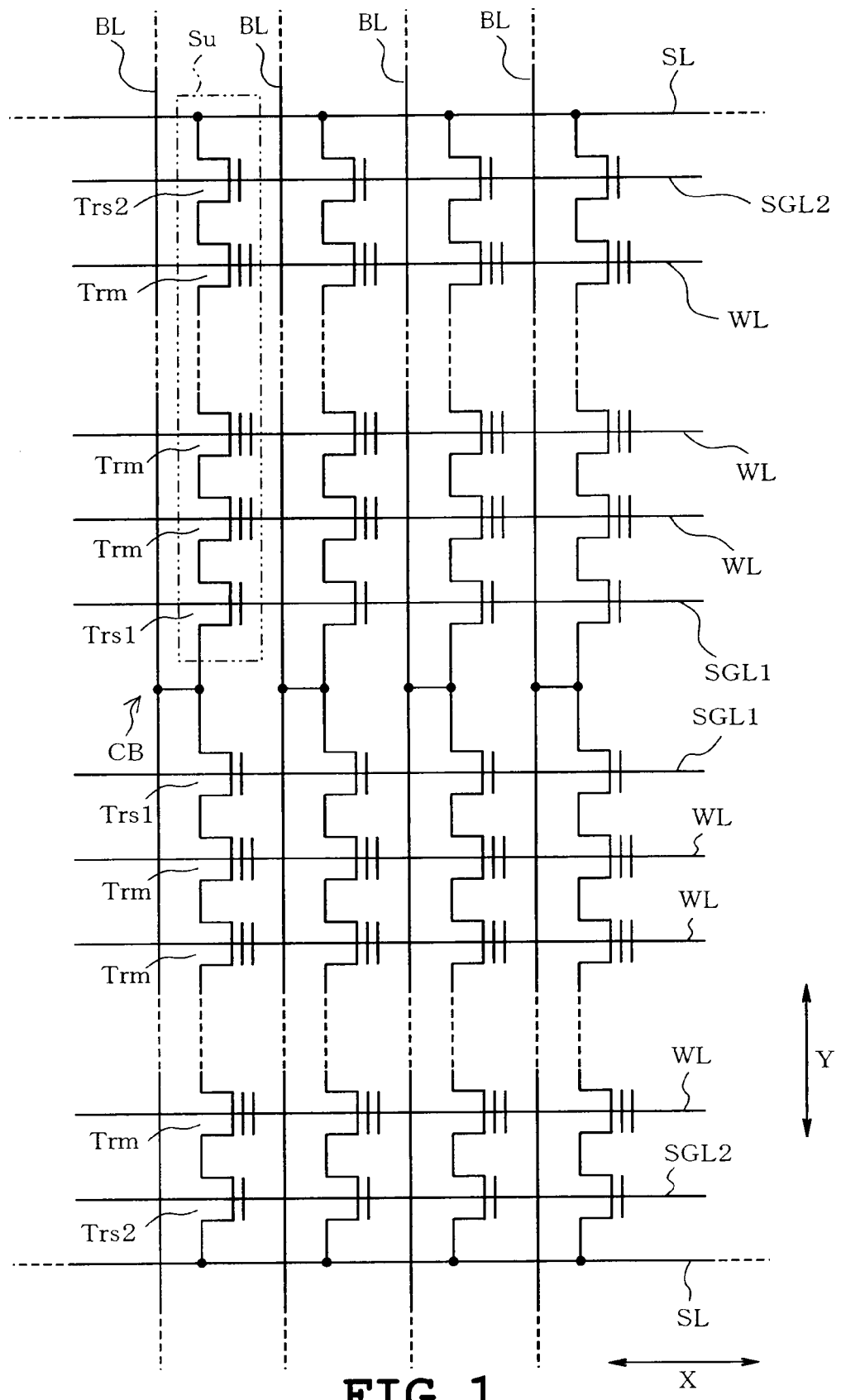
FIG. 1 is an equivalent circuit diagram showing a part of memory cell array of a NAND flash memory device of one embodiment of the invention.

An embodiment of the present invention will be described with reference to the accompanying drawings. The invention is applied to a NAND flash memory in the embodiment. In the following description, identical or similar parts are labeled by the same reference numerals. The drawings typically illustrate the invention, and the relationship between a thickness and plane dimension, layer thickness ratios and the like differ from natural size.

FIG. 1 is an equivalent circuit diagram showing a part of memory cell array of the NAND flash memory device. The memory cell array of the NAND flash memory device includes a matrix of NAND cell units Su each of which includes two selective gate transistors Trs1 and Trs2 and a plurality of memory cell transistors Trm series connected between the selective gate transistors Trs1 and Trs2. The number of the memory cell transistors Trm is represented as $2^n$ where n is a positive number and, for example, 8 in the embodiment as shown in FIG. 1. In each NAND cell unit, source/drain regions are common to the memory cell transistors Trm adjacent to each other.

The memory cell transistors Trm are arranged in the X direction in FIG. 1 (corresponding to a word line direction and gate widthwise direction) and are connected in common by word lines (control gate lines) WL. Furthermore, selective gate transistors Trs1 are arranged in the X direction in FIG. 1 and connected in common by selective gate lines SGL1, and selective gate transistor Trs2 are connected in common by selective gate lines SGL2. Bit line contacts CB are connected to drain regions of the selective gate transistors Trs1. The bit line contacts CB are connected to bit line BL extending in the Y direction (corresponding to lengthwise direction of the gate and bit line direction) intersecting the X direction in FIG. 1. The selective gate transistors Trs2 are connected via source regions to source lines SL extending in the X direction in FIG. 1.

Figure 2:
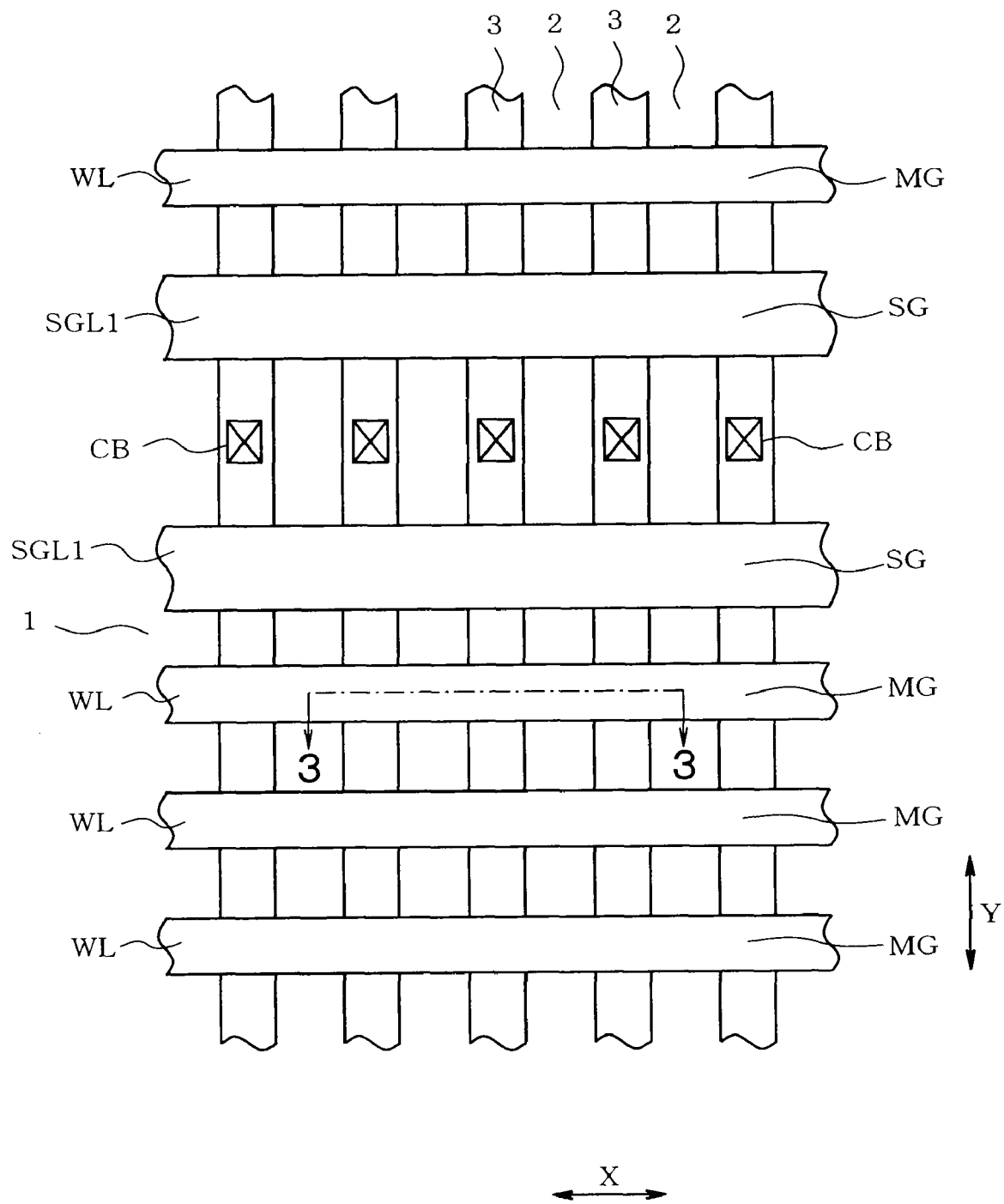
FIG. 2 is a plan view showing a layout pattern of a part of memory cell region.

FIG. 2 is a plan view showing a layout pattern of a part of memory cell region. A plurality of trenches 2 of shallow trench isolation (STI) structure serving as element isolation regions are formed at predetermined intervals in a silicon substrate 1 so as to extend in the Y direction in FIG. 2. Word lines WL of the memory cell transistors are at predetermined intervals so as to extend in the X direction intersecting active regions 3 as viewed in FIG. 2. A pair of selective gate lines SGL1 of the selective gate transistors are formed so as to extend in the X direction in FIG. 2. The bit line contacts CB are formed in the active regions 3 between the paired selective gate lines SGL1 respectively. Gate electrodes MG of the memory cell transistors are formed on the active regions 3 intersecting the word lines WL. The gate electrodes MG serve as first gate electrodes in the invention. Gate electrodes SG of the selective gate transistors are formed on the active regions 3 intersecting the selective gate lines SGL1. The gate electrodes SG serve as second gate electrodes.

Figure 3:
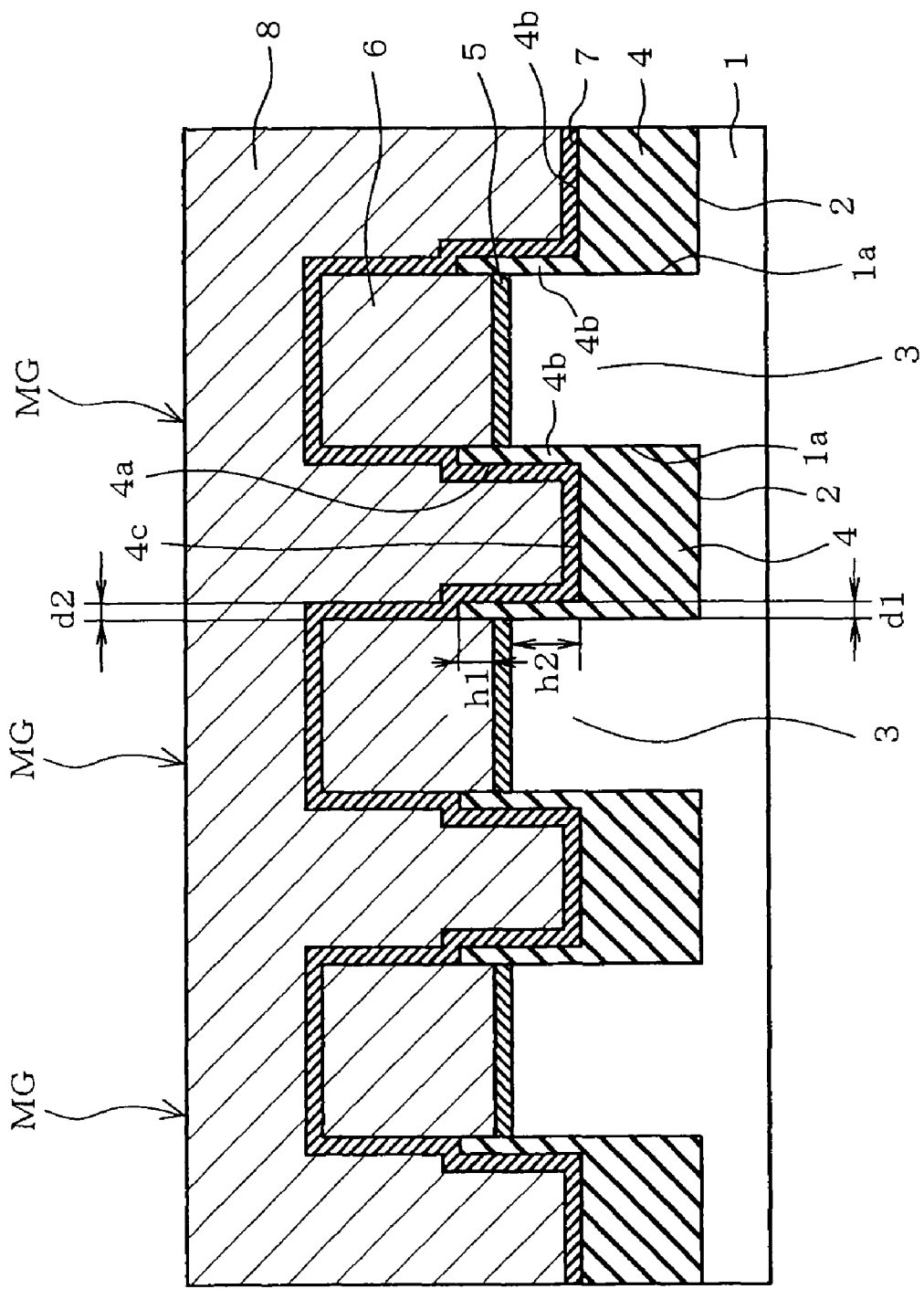
FIG. 3 is a sectional view taken along line 3-3 in FIG. 2.

FIG. 3 is a sectional view taken along line 3-3 in FIG. 2. More specifically, FIG. 3 shows a part of the gate electrode MG of the memory cell transistor cut in the direction crossing the trenches 2 of the STI structure (in the X direction). In FIG. 3, a silicon oxide film 4 serving as an element isolation insulating film is buried in the trenches 1a serving as first trenches formed in the silicon substrate 1, whereby the aforesaid element isolation region or the trenches 2 of the STI structure is formed. A floating gate electrode 6 comprising a polycrystalline silicon film is formed on each active region 3 with a tunnel insulating film 5 being interposed therebetween. Each active region 3 is located in a surface layer of the silicon substrate 1 isolated by the trenches 2 of the STI structure. The tunnel insulating film 5 serves as a first gate insulating film. The floating gate electrode 6 is formed together with the tunnel insulating film 5 and has a side vertically cut to the top thereof with a width according to an end face of a boundary between the active region 3 and the trench 2 of STI structure.

Thus, in forming the trench 1a, the tunnel insulating film 5 and the polycrystalline silicon film of the floating gate electrode 6 are formed. In this state, an anisotropic etching is carried out by a reactive ion etching (RIE) method so that the polycrystalline silicon film of the floating gate electrode 6, the tunnel insulating film 5 and the silicon substrate 1 are collectively etched vertically. As a result, end faces of the floating gate electrode 6, the tunnel insulating film 5 and the silicon substrate 1 are trued up in a self-alignment manner. The silicon oxide film 4 is buried in the trenches 1a formed as described above and the etching process is carried out so that the trenches 2 of the STI structure are formed.

The silicon oxide film 4 composing the trenches 2 of the STI structure has a centrally formed recess 4a serving as a second trench. The recess 4a includes both upper ends 4b in contact with the active region 3 and the floating gate 6. Each upper end 4b includes a portion which is opposed to the sidewall and has a predetermined film thickness d1. The portion of each upper end 4b is formed so as to extend from the sidewall of a portion of the silicon substrate 1 corresponding to the active region 3 beyond the tunnel oxide film 5 so that a predetermined height h1 is achieved. Furthermore, each recess 4a of the silicon oxide film 4 has a central bottom 4c except the ends 4b. The bottom 4c is located lower than the upper surface of the silicon substrate 1 by depth h2. The forming of the silicon oxide film 4 having the above-described recess 4a is realized by setting a suitable etching condition, for example, by a lithography process, RIE method or the like.

An interelectrode insulating film 7 having a film thickness d2 extends over the upper surface and sides of each floating gate electrode 6, and the upper surface and sides of the silicon oxide film 4 buried in the trench 2 defined between the floating gate electrodes 6. The interelectrode insulating film 7 serves as a second gate insulating film and comprises an ONO film. The film thickness d2 of the interelectrode insulating film 7 is set to be approximately equal to a film thickness d1 of a portion of the silicon oxide film 4 in contact with the floating gate electrode 6 and the active region 3 (d1=d2). Furthermore, a polycrystalline silicon film serving as a control gate electrode 8 is formed on an entire upper surface of the interelectrode insulating film 7. The control gate electrode 8 is formed so as to be buried in the recess 4a of the silicon oxide film 4. The control gate electrode 8 is opposed to the polycrystalline silicon film of the floating gate electrode 6 with the interelectrode insulating film 7 being interposed therebetween and is further opposed to the sidewall of the active region 3 of the silicon substrate 1 with the interelectrode insulating film 7 and the silicon oxide film 4.

The state as shown in FIG. 3 shows the section taken along line 3-3 in FIG. 2. Accordingly, the control gate electrode 8 is formed so as to connect the floating gate electrodes 8. However, as shown in FIG. 2, the section is divided so as to be strip-shaped in the Y direction. As a result, the active regions 3 of the divided portions are exposed. Each active region 3 exposed between the gate electrodes is doped with n-type impurities, whereby a source/drain region is formed.

Although the state as shown in FIG. 3 is described above, a silicide film or the like is subsequently deposited on the upper portion in the actual NAND flash memory device and formed into a gate electrode. The actual NAND flash memory device is formed through further processing steps.

The following advantages are achieved from the above-described configuration. A large element determining a memory characteristic in the NAND flash memory device is that a large value of coupling ratio can be obtained. In the above-described configuration, the coupling ratio can be rendered larger than in the conventional configuration. The coupling ratio R is shown as a ratio (R=C2/(C1+C2)) of a capacity value C2 between the floating gate 6 and the control gate electrode 8 to the sum (C1+C2) of a capacity value C1 between the floating gate electrode 6 and the active region 3 and C2. The capacity value C1 corresponds to an area of a part of the floating gate electrode 6 opposed to the active region 3. Accordingly, in order that the coupling ratio R may be increased under the condition that the capacity value C1 remains unchanged, the capacity value C2 needs to be increased. Regarding the capacity value C2, in the embodiment, a portion where the floating gate electrode 6 and the control gate electrode 8 are opposed to each other is considered. Capacity value C2 includes a capacity value C2a of the portion where the floating gate electrode 6 and the control gate electrode 8 are opposed to each other with the upper part interelectrode insulating film 7 and a capacity value C2b of the portion where the floating gate electrode 6 and the control gate electrode 8 are opposed to each other with the lower part interelectrode insulating film 7 and the silicon oxide film 4. The capacity value C2 is a sum of these values (C2=C2a+C2b).

More specifically, the upper surface of the silicon oxide film 4 forming the trenches 2 of the STI structure is formed as the bottom 4c which is located lower than the upper surface of the silicon substrate 1 except the upper end 4b of the recess 4a. Accordingly, the capacity value C2b contributing to the coupling ratio R can be obtained from this portion and is effective to increase the coupling ratio R. Furthermore, when the capacity value C2b is added, both values of numerator and denominator are also increased, whereby variations in the coupling ratio R can be reduced. Consequently, variations in the threshold value distribution after writing can be suppressed. This can realize a high-performance memory cell having high reliability in single level cells, for example, when a distribution width needs to be narrowed, for example, in the case of multilevel cells, or when the writing speed needs to be increased.

Furthermore, the silicon oxide film 4 forming the trenches 2 of the STI structure includes the central bottom 4c formed in the recess 4a except the ends 4b. The bottom 4c is formed as the recess lower than the upper surface of the silicon substrate 1. Since the polycrystalline silicon film of the control gate electrode 8 is buried in the element isolation insulating film between the floating gate electrodes of the adjacent memory cells, the parasitic capacity between the adjacent floating gate electrodes 6 can be reduced to a large degree.

One of important parameters in the cell structure as shown in the embodiment is the film thickness d1 of the end 4b of the silicon oxide film 4. serving as the element isolation insulating film. More specifically, the central portion of the silicon oxide film 4 is formed into the recess as described above, whereby the central portion is dug. The remaining side of the floating gate electrode 6 serving as the end 4b of the silicon oxide film 4 and the end 4b at the side of the silicon substrate 1 contribute to the film thickness d1. When the thickness d1 of the end 4b of the silicon oxide film 4 is excessively large at the side of the floating gate electrode 6, the capacity value C2 between the control gate electrode 8 and the floating gate electrode 6 is rendered excessively small, whereupon the film thickness d1 cannot contribute to improvement in the coupling ratio R. Accordingly, it is advantageous that the silicon oxide film 4a at the side of the floating gate electrode 6 is thinner and preferably, no more than the film thickness d2 of the interelectrode insulating film 7.

On the other hand, in the case where the film thickness d1 of the end 4b of the silicon oxide film 4 is excessively small at the side of the silicon substrate 1, a proper breakdown voltage cannot be ensured for the end 4b of the silicon oxide film 4 between the control gate electrode 8 and the silicon substrate 1 when a writing voltage of about 20V, for example, is applied to the control gate electrode 8. Accordingly, it is advantageous that the silicon oxide film 4a at the side of the floating gate electrode 6 is thinner and preferably, no more than the film thickness d2 of the interelectrode insulating film 7. In view of the above-described both conditions, the cell structure of the embodiment is formed so that the film thickness d1 of the end 4b of the silicon oxide film 4 at the side of the floating gate electrode 6 and at the side of the silicon substrate 1 is approximately the same as the film thickness d2 of the interelectrode insulating film 7.

Figure 4:
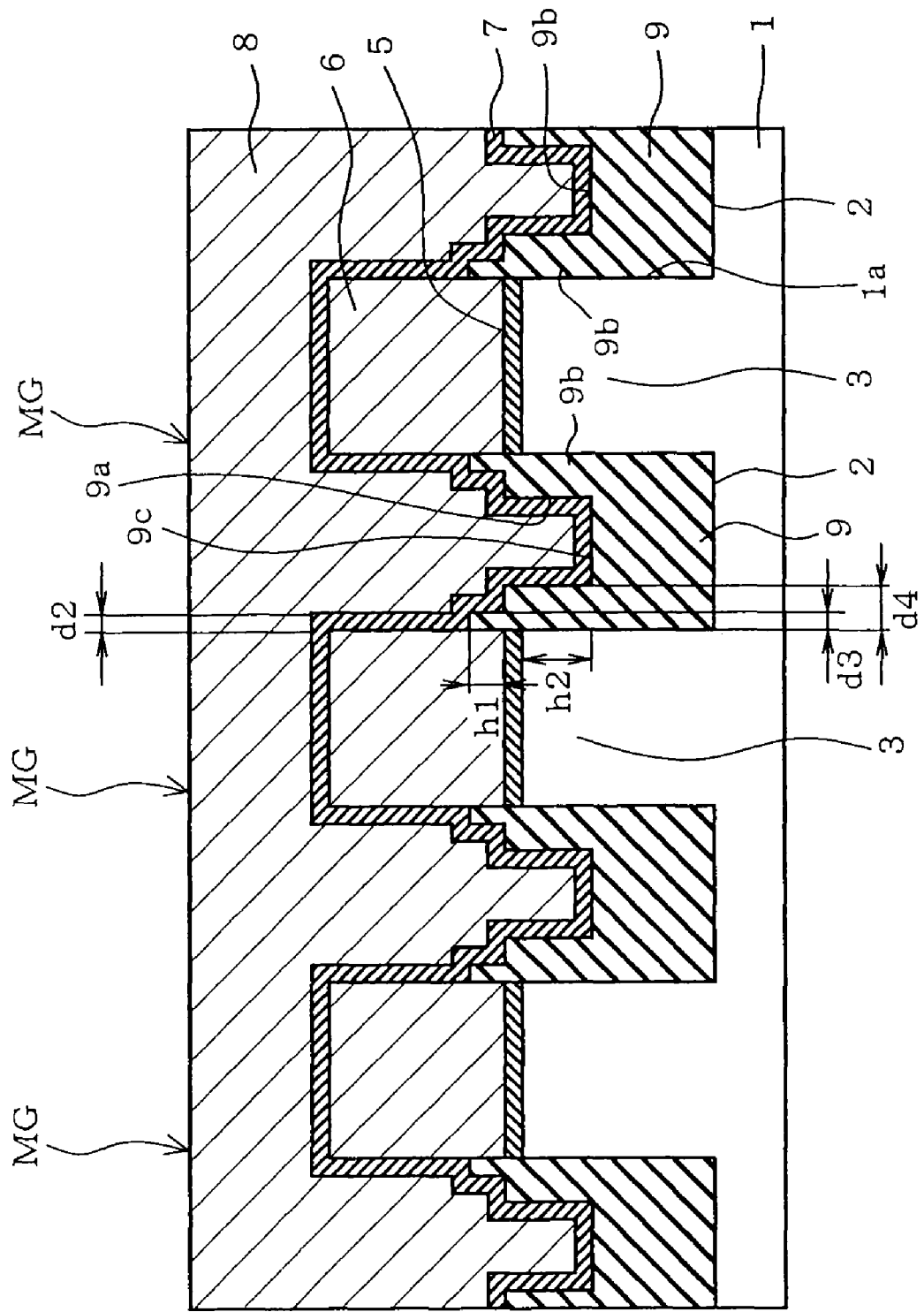
FIG. 4 is a view similar to FIG. 3, showing a second embodiment.

FIG. 4 illustrates a second embodiment of the invention. The second embodiment differs from the first embodiment in that a silicon oxide film 9 is provided as the element isolation insulating film, instead of the silicon oxide film 4 buried in the trenches 1a serving as the first trench. The silicon oxide film 9 has a different sectional configuration from the silicon oxide film 4. In FIG. 4, the silicon oxide film 9 is formed with a recess 9a serving as the second trench in the same manner as in the first embodiment. The silicon oxide film 9 is formed so that both side ends 9b of the upper surface thereof have a stepwise structure.

More specifically, the end 9b of the recess 9a of the silicon oxide film 9 includes an upper portion in contact with the floating gate electrode 6. The upper portion includes a part opposed to the sidewall extending from the upper end to the tunnel oxide film 4. The part has a film thickness d3. The end 9b further includes a lower portion which is located lower than the upper portion and includes a part opposed to the sidewall and formed so that the film thickness thereof is increased stepwise. The lower portion includes a part which is located lower than the upper surface of the silicon substrate 1 by a depth h2 and has a film thickness d4. Consequently, the central bottom 9c of the silicon oxide film 9 is formed as a recess having a smaller width than in the first embodiment.

In the above-described configuration, the film thicknesses d3 and d4 of the end 9b of the silicon oxide film 9 are set so as to meet the following conditions. The film thickness d3 of the end 9b is set so as to be smaller than the film thickness d2 of the interelectrode insulating film 7 (d3<d2), and the film thickness d4 is set so as to be larger than the film thickness d2 of the interelectrode insulating film 7 (d4>d2).

When compared with the first embodiment, the second embodiment provides the configuration that the film thickness d3 of the portion of the end 9b of the recess 9a opposed to the floating gate electrode 6 is set so as to be smaller than the film thickness d2 of the interelectrode insulating film 7. Consequently, the coupling ratio R can be rendered larger in the second embodiment than in the first embodiment, and moreover, process variations can further be reduced.

Furthermore, the end 9b of the recess 9a of the silicon oxide film in contact with the sidewall of the active region 3 has the film thickness d4 larger than the film thickness d2 of the interelectrode insulating film 7. Consequently, the breakdown voltage between the end 9b and the control gate electrode 8 can be improved.

Figure 5:
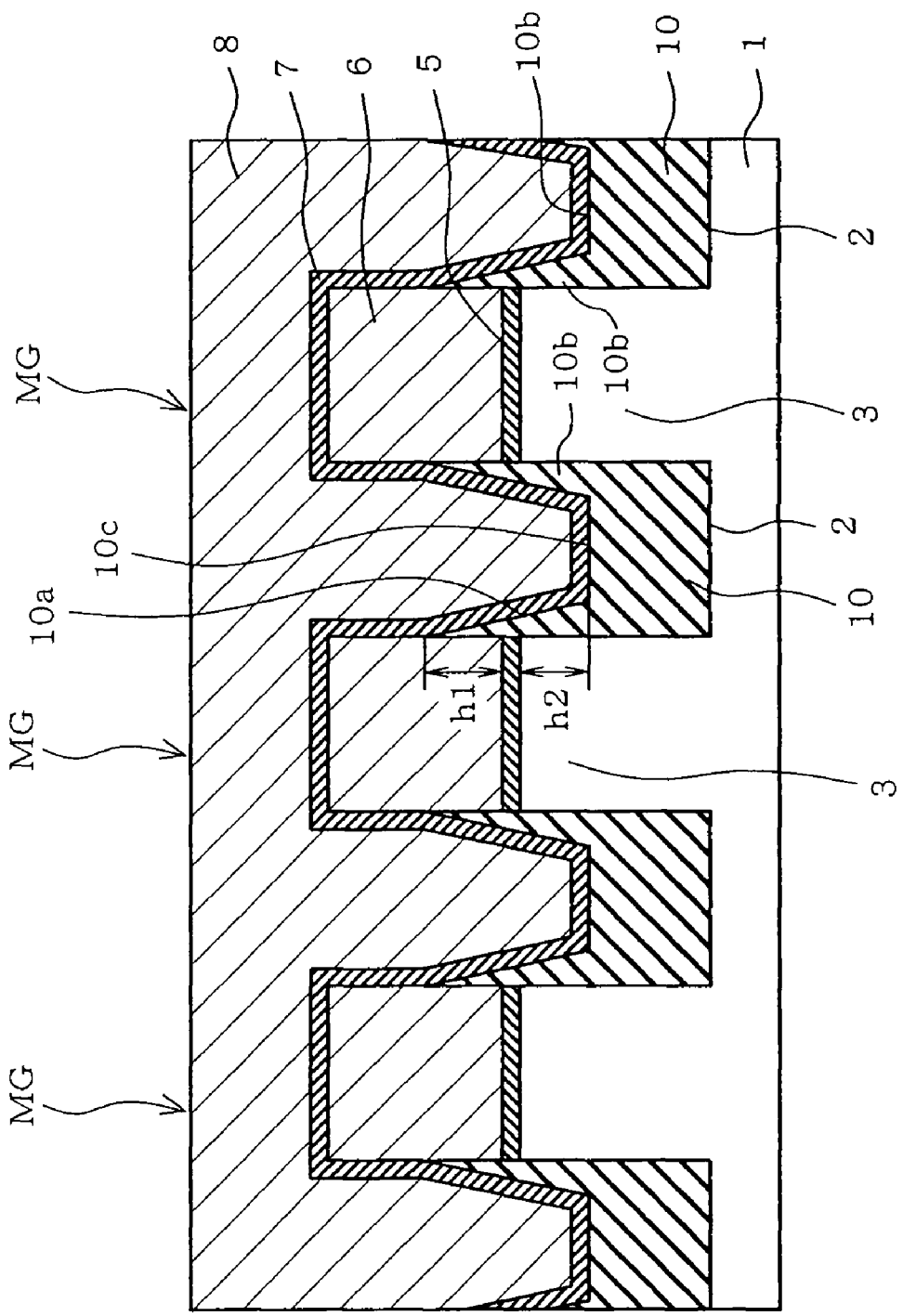
FIG. 5 is a view similar to FIG. 3, showing a third embodiment.
Figure 6:
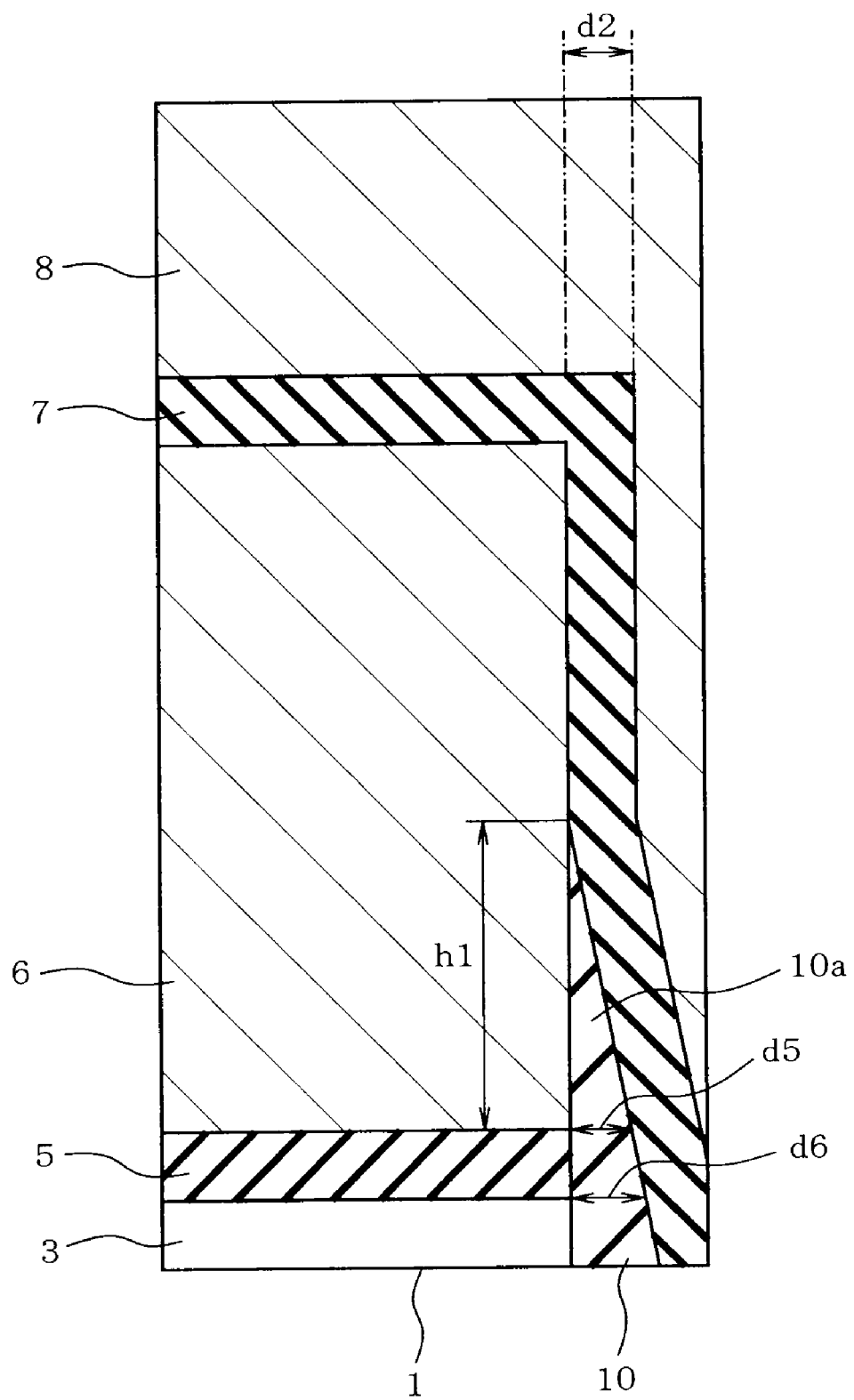
FIG. 6 is a sectional view showing a relationship of film thicknesses of the major part of the device.

FIGS. 5 and 6 illustrate a third embodiment of the invention. The third embodiment differs from the first embodiment in that a silicon oxide film 10 is provided as the element isolation insulating film, instead of the silicon oxide film 4 buried in the trenches 1a serving as the first trench. The silicon oxide film 10 has a different sectional configuration from the silicon oxide film 4. In FIG. 5, the silicon oxide film 10 is formed with a recess 10a in the same manner as in the first embodiment. The silicon oxide film 10 is formed so that both side ends 10b have a sectional structure formed into such a tapered shape that a film thickness is reduced upward.

More specifically, the end 10b of the recess 10a of the silicon oxide film 10 includes the tunnel oxide film 4 extending from a portion extending from a part of the upper portion which has a height h1 and is in contact with the floating gage 6 and a tapered or inclined face extending from the surface of the silicon substrate 1 to a portion below the active region 3 and having a height h2. A part inside the tapered part inside the ends 10b or the bottom 10c of the recess 10a of the silicon oxide film 10 is formed as the recess located lower than the upper surface of the silicon substrate 1 by the height h2.

The following describes the film thickness of the end 10b of the silicon oxide film 10. FIG. 6 shows the enlarged major part of the device and more specifically, shows the portion of one of the ends 10a of the silicon oxide film 10 in contact with the floating gate electrode 6 and the active region 3. The end 10b of the silicon oxide film 10 includes a part which is in contact with the sidewall of the floating gate electrode 6 and has the height h1. This part is formed so that the film thickness thereof is increased from approximately 0 downward and a thickness d5 at the height of the underside of the floating gate electrode 6. The thickness d5 is set smaller than the film thickness d2 of the interelectrode insulating film 7 (d5<d2). A thickness d6 of the part at the height of the upper surface of the silicon substrate 1 is larger than the film thickness d2 of the interelectrode insulating film 7 (d6>d2). The processing of the silicon oxide film 10 meeting the above-described dimensional relationship can readily be realized by tapering by an etching process such as the RIE method.

The silicon oxide film 10 as the element isolation insulating film is processed so as to be tapered, whereupon the same effect can be achieved in the third embodiment as in the second embodiment. As a result, the processing of the silicon oxide film 10 can be carried out by one time of tapering processing. Consequently, the processing can be carried out easily and quickly on the manufacturing process.

The invention should not be limited to the foregoing embodiments. The embodiments may be modified or expanded as described in the following. The ends 4b, 9b and 10b of the silicon oxide films 4, 9 and 10 serving as the element isolation insulating films may be set to suitable film thicknesses within ranges meeting the conditions of film thicknesses respectively. Furthermore, the sectional configurations of the ends 9b and 10b of the silicon oxide films 9 and 10 serving as the element isolation insulating films may take the form obtained by combining the stepwise configuration as exemplified in the second embodiment and the tapered configuration as exemplified in the third embodiment.

The foregoing description and drawings are merely illustrative of the principles of the present invention and are not to be construed in a limiting sense. Various changes and modifications will become apparent to those of ordinary skill in the art. All such changes and modifications are seen to fall within the scope of the invention as defined by the appended claims.

What is claimed is:

1. A nonvolatile semiconductor memory device comprising:
   a semiconductor substrate having an upper surface in which a plurality of first trenches are formed such that an element forming region is defined, the first trenches having respective sidewalls;
   an element isolation insulating film buried in the first trenches;
   a floating gate electrode formed on the element forming region with a first gate insulating film being interposed therebetween, the floating gate electrode being formed so as to have a sidewall which extends from a bottom thereof to an upper portion thereof and is substantially an extension of a sidewall of each first trench;
   a second gate insulating film formed on upper portions of the floating gate electrode and the element isolation insulating film; and
   a control gate electrode formed on the second gate insulating film,
   wherein the element isolation insulating film has an upper end located lower than an upper surface of the floating gate electrode and the upper end of the element isolation insulating film includes a sidewall having such a height as to be in contact with the floating gate electrode;
   the element isolation insulating film includes a central portion in which a second trench is formed, the second trench having a bottom located lower than the upper surface of the semiconductor substrate;
   the sidewall of the floating gate electrode includes an upper portion opposed to the control gate electrode with the second gate insulating film being interposed therebetween, the sidewall of the floating gate electrode including a lower portion opposed to the control gate electrode with the element isolation insulating film and the second gate insulating film being interposed therebetween in turn;

the control gate electrode is buried in the second trench with the second gate insulating film being interposed therebetween, the control gate electrode having a lower end including a sidewall opposed to the sidewall of each first trench with the second gate insulating film and the element isolation insulating film being interposed therebetween; and the element isolation insulating film includes a portion located between the sidewall of each first trench and a sidewall of the second trench, said upper end and said portion of the element isolation insulating film having a film thickness in a direction along the upper surface of the semiconductor substrate, said film thickness being equal to a film thickness of the second gate insulating film.

2. A nonvolatile semiconductor memory device comprising:

a semiconductor substrate having an upper surface in which a plurality of first trenches are formed such that an element forming region is defined, the first trenches having respective sidewalls;

an element isolation insulating film buried in the first trenches;

a floating gate electrode formed on the element forming region with a first gate insulating film being interposed therebetween, the floating gate electrode being formed so as to have a sidewall which extends from a bottom thereof to an upper portion thereof and is substantially an extension of a sidewall of each first trench;

a second gate insulating film formed on upper portions of the floating gate electrode and the element isolation insulating film; and a control gate electrode formed on the second gate insulating film, wherein the element isolation insulating film has an upper end located lower than an upper surface of the floating gate electrode and the upper end of the element isolation insulating film includes a sidewall having such a height as to be in contact with the floating gate electrode;

the element isolation insulating film includes a central portion in which a second trench is formed, the second trench having a bottom located lower than the upper surface of the semiconductor substrate;

the sidewall of the floating gate electrode includes an upper portion opposed to the control gate electrode with the second gate insulating film being interposed therebetween, the sidewall of the floating gate electrode including a lower portion opposed to the control gate electrode with the element isolation insulating film and the second gate insulating film being interposed therebetween in turn;

the control gate electrode is buried in the second trench with the second gate insulating film being interposed therebetween, the control gate electrode having a lower end including a sidewall opposed to the sidewall of each first trench with the second gate insulating film and the element isolation insulating film being interposed therebetween;

the element isolation insulating film includes a portion located higher than an upper surface of the first gate insulating film, said portion of the element isolation insulating film having a film thickness in a direction along the upper surface of the semiconductor substrate, said film thickness being smaller than a film thickness of the second gate insulating film; and the element isolation insulating film includes a portion located between the sidewall of each first trench and a sidewall of the second trench, said portion of the element isolation insulating film having a film thickness in a direction along the upper surface of the semiconductor substrate, said film thickness being larger than the film thickness of the second gate insulating film.

3. A nonvolatile semiconductor memory device comprising:

a semiconductor substrate having an upper surface in which a plurality of first trenches are formed such that an element forming region is defined, the first trenches having respective sidewalls;

an element isolation insulating film buried in the first trenches;

a floating gate electrode formed on the element forming region with a first gate insulating film being interposed therebetween, the floating gate electrode being formed so as to have a sidewall which extends from a bottom thereof to an upper portion thereof and is substantially an extension of a sidewall of each first trench;

a second gate insulating film formed on upper portions of the floating gate electrode and the element isolation insulating film; and a control gate electrode formed on the second gate insulating film, wherein the element isolation insulating film has an upper end located lower than an upper surface of the floating gate electrode and the upper end of the element isolation insulating film includes a sidewall having such a height as to be in contact with the floating gate electrode;

the element isolation insulating film includes a central portion in which a second trench is formed, the second trench having a bottom located lower than the upper surface of the semiconductor substrate;

the second trench includes a pair of sidewalls and a distance between the sidewalls is gradually reduced from the upper end toward the bottom of the second trench;

the sidewall of the floating gate electrode includes an upper portion opposed to the control gate electrode with the second gate insulating film being interposed therebetween, the sidewall of the floating gate electrode including a lower portion opposed to the control gate electrode with the element isolation insulating film and the second gate insulating film being interposed therebetween in turn;

the control gate electrode is buried in the second trench with the second gate insulating film being interposed therebetween, the control gate electrode having a lower end including a sidewall opposed to the sidewall of each first trench with the second gate insulating film and the element isolation insulating film being interposed therebetween;

the element isolation insulating film includes a portion located higher than an upper surface of the first gate insulating film, said portion of the element isolation insulating film having a film thickness in a direction along the upper surface of the semiconductor substrate, said film thickness being smaller than a film thickness of the second gate insulating film; and the element isolation insulating film includes a portion located between the first and second trenches, said portion of the element isolation insulating film having a film thickness in a direction along the upper surface of the semiconductor substrate, said film thickness being larger than a film thickness of the second gate insulating film.

4. The device according to claim 1, wherein the element isolation insulating film is a silicon oxide film.

5. The device according to claim 1, wherein the second gate insulating film is an ONO (oxide-nitride-oxide) film.

6. The device according to claim 1, wherein the floating gate electrode is a polycrystalline silicon film.

7. The device according to claim 1, wherein the first gate insulating film is a tunnel insulating film.

8. The device according to claim 1, wherein the floating gate electrode, the second gate insulating film, and the control gate electrode form a gate electrode of a memory cell transistor of a NAND flash memory device.

9. The device according to claim 2, wherein the element isolation insulating film is a silicon oxide film.

10. The device according to claim 2, wherein the second gate insulating film is an ONO (oxide-nitride-oxide) film.

11. The device according to claim 2, wherein the floating gate electrode is a polycrystalline silicon film.

12. The device according to claim 2, wherein the first gate insulating film is a tunnel insulating film.

13. The device according to claim 2, wherein the floating gate electrode, the second gate insulating film, and the control gate electrode form a gate electrode of a memory cell transistor of a NAND flash memory device.

14. The device according to claim 3, wherein said portion of the element isolation insulating film located between the first and second trenches has a surface which is opposed to the second trench and tapered.

15. The device according to claim 14, wherein the element isolation insulating film includes a portion which has a film thickness in a direction along the surface of the semiconductor substrate, said film thickness being equal to the film thickness of the second gate insulating film, said portion of the element isolation insulating film being formed so as to be located at the portion of the element isolation insulating film which is located between the first and second trenches and opposed to the first gate insulating film.

16. The device according to claim 3, wherein the element isolation insulating film is a silicon oxide film.

17. The device according to claim 3, wherein the second gate insulating film is an ONO (oxide-nitride-oxide) film.

18. The device according to claim 3, wherein the floating gate electrode is a polycrystalline silicon film.

19. The device according to claim 3, wherein the first gate insulating film is a tunnel insulating film.

20. The device according to claim 3, wherein the floating gate electrode, the second gate insulating film, and the control gate electrode form a gate electrode of a memory cell transistor of a NAND flash memory device.

* * * * *